(12) United States Patent
Lu et al.

(10) Patent No.: US 10,455,720 B2
(45) Date of Patent: Oct. 22, 2019

(54) FIXING APPARATUS FOR HOLDING CIRCUIT BOARD IN PLACE

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Li-Chin Lu, New Taipei (TW); Jian-Hua Xiang, Shenzhen (CN); Jia-Yu Lv, Shenzhen (CN); Zhan-Wang Xu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 127 days.

(21) Appl. No.: 15/856,061

(22) Filed: Dec. 28, 2017

(65) Prior Publication Data

US 2019/0069429 A1    Feb. 28, 2019

(30) Foreign Application Priority Data

Aug. 29, 2017   (CN) .......................... 2017 1 0758217

(51) Int. Cl.
| | |
|---|---|
| *B23Q 3/06* | (2006.01) |
| *H05K 7/14* | (2006.01) |
| *H05K 5/03* | (2006.01) |
| *H05K 3/22* | (2006.01) |

(52) U.S. Cl.
CPC ........... *H05K 7/1417* (2013.01); *H05K 3/225* (2013.01); *H05K 5/03* (2013.01); *H05K 7/1402* (2013.01); *H05K 7/1427* (2013.01); *H05K 2203/0165* (2013.01); *H05K 2203/176* (2013.01)

(58) Field of Classification Search
CPC .......... B23Q 3/06; B23Q 3/069; B23Q 3/088; B25B 11/005; H05K 3/225; H05K 7/1408; H05K 7/1417; Y10T 29/53265
See application file for complete search history.

(56) References Cited

U.S. PATENT DOCUMENTS

| | | | | |
|---|---|---|---|---|
| 684,142 | A * | 10/1901 | Ward ...................... | B23Q 3/06 269/224 |
| 3,301,548 | A * | 1/1967 | Rathbun .................. | B23Q 3/06 269/196 |
| 3,476,377 | A * | 11/1969 | Agrista ..................... | B25B 5/06 264/553 |
| 3,711,082 | A * | 1/1973 | Seidenfaden ......... | B25B 11/005 269/21 |
| 3,810,289 | A * | 5/1974 | Hannabery ............ | H01R 43/00 29/56.6 |
| 3,851,758 | A * | 12/1974 | Makhijani ........... | H01L 21/3043 206/710 |
| 4,393,580 | A * | 7/1983 | Hall, Jr. ............... | H01R 43/015 29/749 |

(Continued)

*Primary Examiner* — Bradley Duckworth
(74) *Attorney, Agent, or Firm* — ScienBiziP, P.C.

(57) ABSTRACT

A fixing apparatus for holding a circuit board in place includes a cover plate, a base for supporting the circuit board thereon, a connecting assembly for hinge-coupling a first end of the cover plate to the base, and a latching assembly for latching a second end of the cover plate to the base. The circuit board is held in place between the base and the cover plate.

11 Claims, 4 Drawing Sheets

(56) References Cited

U.S. PATENT DOCUMENTS

| | | | | |
|---|---|---|---|---|
| 4,494,433 | A * | 1/1985 | Gerber | B08B 15/00 |
| | | | | 83/100 |
| 7,214,077 | B2 * | 5/2007 | Lu | H05K 5/0013 |
| | | | | 439/157 |
| 8,979,566 | B2 * | 3/2015 | Yeh | H01R 13/62933 |
| | | | | 439/331 |
| 9,756,752 | B2 * | 9/2017 | Ma | H05K 7/142 |
| 2013/0168910 | A1 * | 7/2013 | Sun | B23Q 3/088 |
| | | | | 269/21 |
| 2018/0054912 | A1 * | 2/2018 | Hannig | H05K 7/1417 |
| 2018/0215000 | A1 * | 8/2018 | Blick | B25B 11/005 |

* cited by examiner

FIXING APPARATUS FOR HOLDING CIRCUIT BOARD IN PLACE

CROSS-REFERENCE TO RELATED APPLICATIONS

This application claims priority to Chinese Patent Application No. 201710758217.2 filed on Aug. 29, 2017, the contents of which are incorporated by reference herein.

FIELD

The subject matter herein generally relates to circuit boards, and more particularly to a fixing apparatus for holding a circuit board in place during a process of removing components from the circuit board.

BACKGROUND

Generally, when a circuit board needs to be repaired or have components removed, there is a risk of damaging the circuit board.

BRIEF DESCRIPTION OF THE DRAWINGS

Implementations of the present disclosure will now be described, by way of example only, with reference to the attached figures.

DETAILED DESCRIPTION

Figure 1:
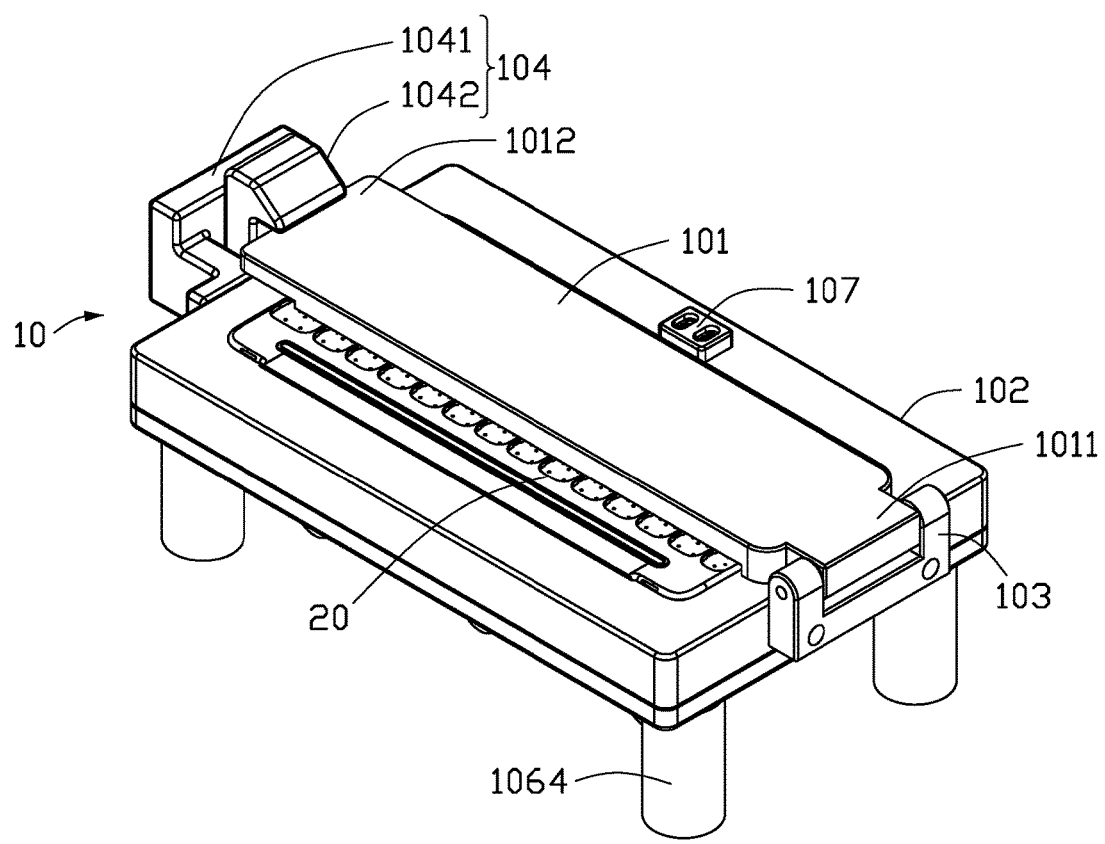
FIG. 1 is an assembled, isometric view of an exemplary embodiment of a fixing apparatus for holding a circuit board in place.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIGS. 1-4 illustrate a fixing apparatus 10 for holding a circuit board or other thin board in place, in accordance with an exemplary embodiment of the present application. As illustrated in FIG. 1, in at least one embodiment, the fixing apparatus 10 may hold a circuit board 20 in place during a process of removing components from the circuit board 20 to prevent damage to the circuit board 20.

In at least one embodiment, the fixing apparatus may include a cover plate 101, a base 102, a connecting assembly 103, and a latching assembly 104.

The cover plate 101 is covered over the base 102, and the cover plate 101 and the base 102 cooperatively clamp the circuit board 20 therebetween to hold the circuit board 20 in place.

In at least one embodiment, the cover plate 101 is substantially rectangular and includes a first end 1011 and a second end 1012 opposite to the first end 1011. The first end 1011 is hinge-coupled to the base 102 by the connecting assembly 103. The second end 1012 is latched to the base 102 by the latching assembly 104. When the cover plate 101 is covered over the base 102, the latching assembly 104 latches the second end 1012 to hold the circuit board 20 in place between the cover plate 101 and the base 102.

Figure 2:
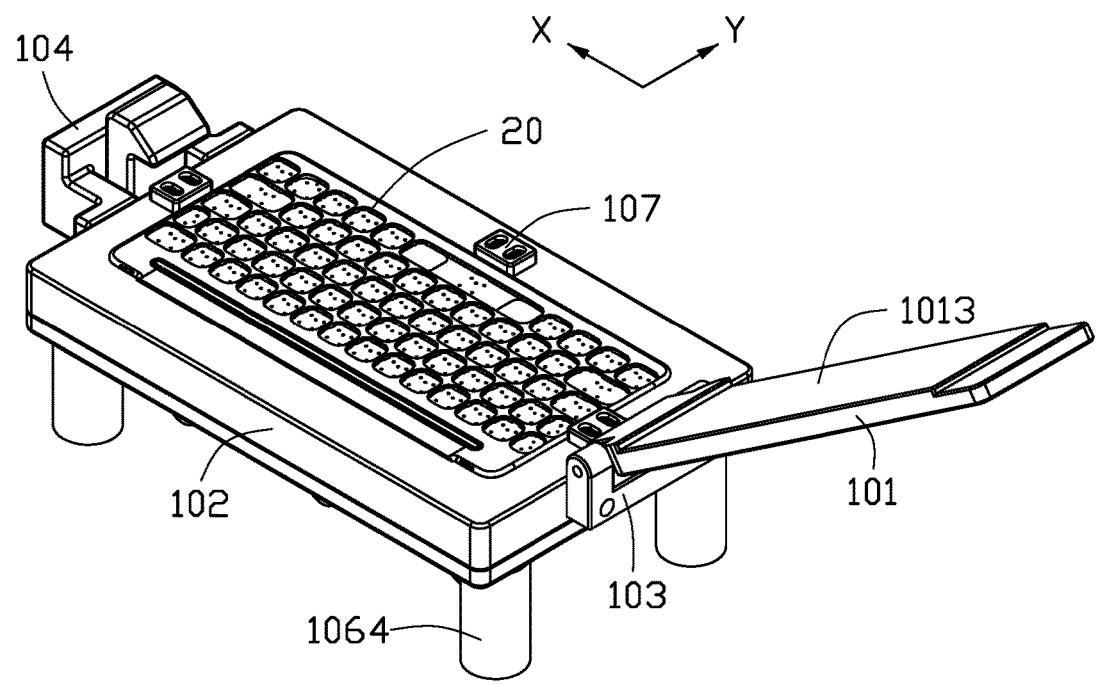
FIG. 2 is similar to FIG. 1, but shows the fixing apparatus in another state of use.

Referring to FIG. 2, a surface of the cover plate 101 facing the base 102 defines a recess 1013 for accommodating the circuit board 20. The circuit board 20 accommodated in the recess 1013 can prevent the circuit board 20 being squeezed between the cover plate 101 and the base 102 when the cover plate 101 is covered over the base 102. In at least one embodiment, a size and a shape of the recess 1013 corresponds to a size and shape of the circuit board 20. The base 102 may be substantially box-shaped and support the circuit board 20 thereon.

Figure 3:
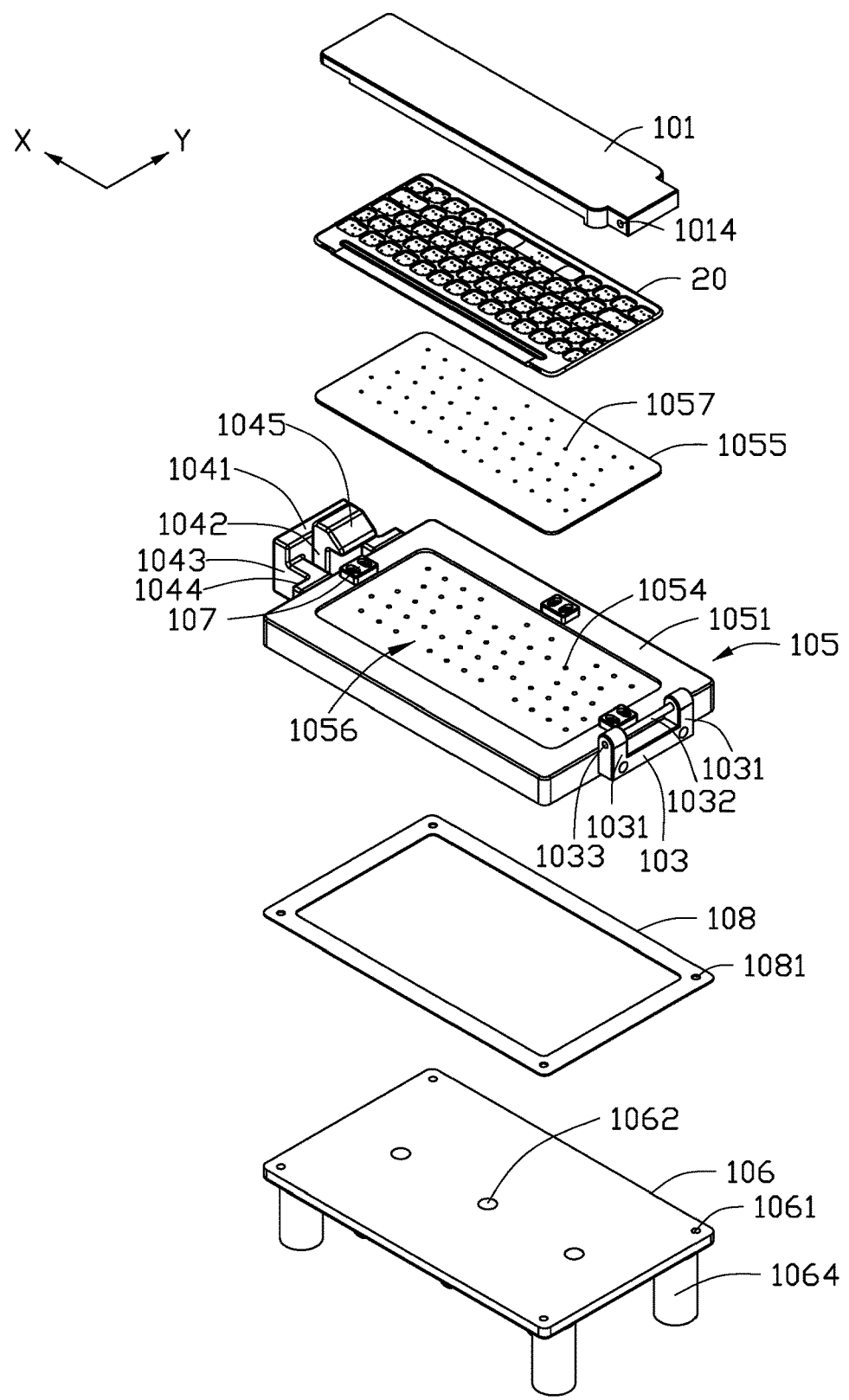
FIG. 3 is an exploded view of the fixing apparatus of FIG. 1.
Figure 4:
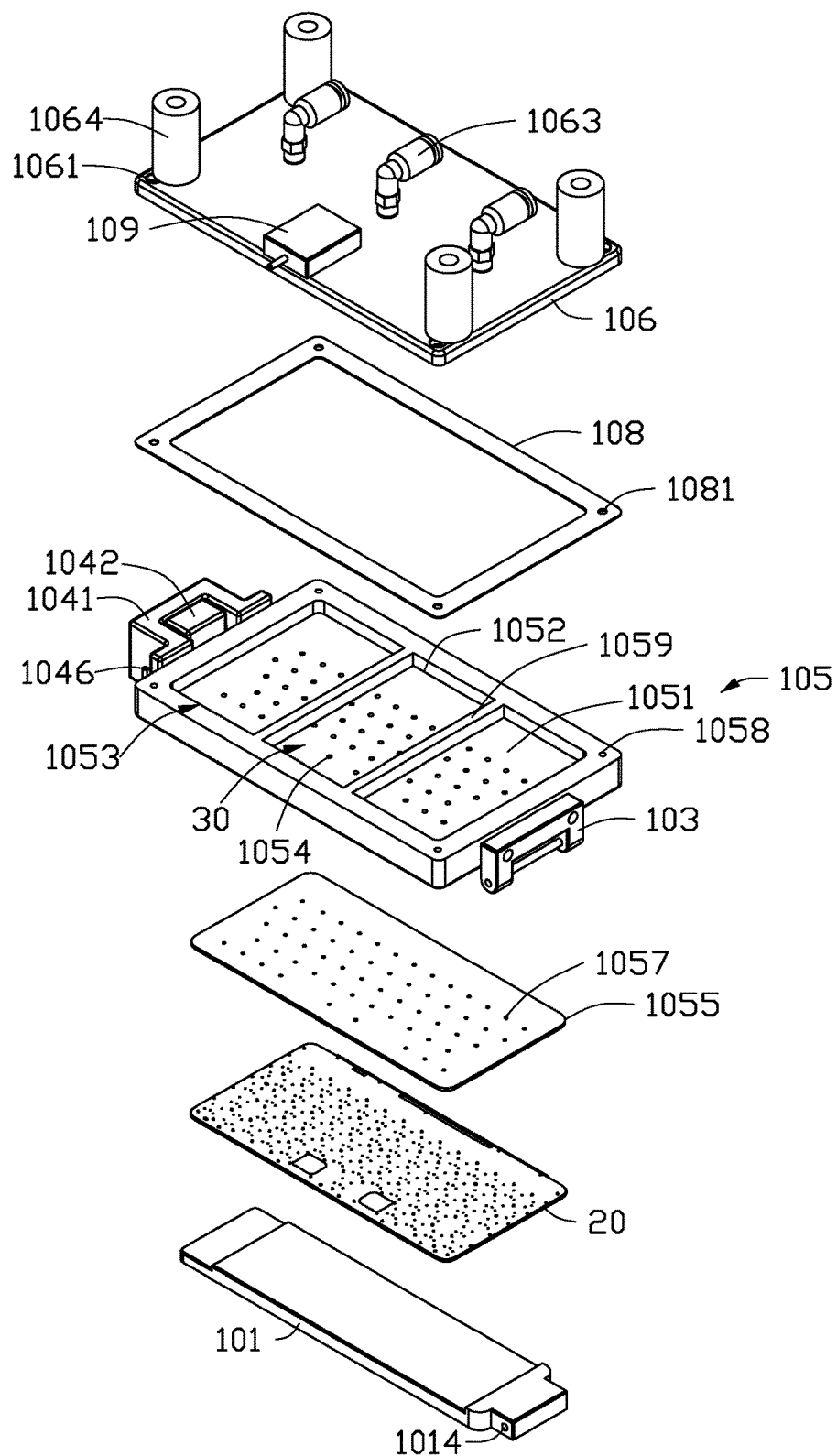
FIG. 4 is similar to FIG. 3, but shows the fixing apparatus from another angle.

Referring to FIGS. 3 and 4, the base 102 may be substantially hollow. The base 102 may not only support the circuit board 20 thereon, but also fix the circuit board 20 in place.

The base 102 may include a main body 105 including a top plate 1051 and a peripheral wall 1052. The peripheral wall 1052 may surround a periphery of the top plate 1051. A cavity 1053 may be defined by the peripheral wall 1052. The main body 105 may include a bottom plate 106. The bottom plate 106 may cover the cavity 1053.

In at least one embodiment, the top plate 1051 is substantially rectangular and defines a plurality of first through holes 1054. The first through holes 1054 pass through the top plate 1051 to communicate with the cavity 1053. The circuit board 20 on the base 102 is located on a surface of the top plate 1051 away from the cavity 1053 and covers the first through holes 1054.

The base 102 may further include two positioning blocks 107. In at least one embodiment, the positioning blocks 107 are made of fiberglass. The positioning blocks 107 may be arranged on a surface of the top plate 1051 away from the cavity 1053. One of the positioning blocks 107 may be arranged at a side of the top plate 1051 to limit a position of the circuit board 20 along a first direction (e.g., X-axis), and another one of the positioning blocks 107 may be arranged at a side of the top plate 1051 to limit a position of the circuit board 20 along a second direction (e.g., Y-axis). A position of the positioning blocks 107 can be adjusted to position the circuit board 20. The first direction and the second direction are perpendicular to each other. The positioning blocks 107 can prevent the circuit board 20 from deviating along the X-axis or the Y-axis during a process of removing components from the circuit board 20.

The main body 105 may further include a cushion member 1055. A surface of the top plate 1051 away from the cavity 1053 may define a mounting recess 1056. The mounting recess 1056 can accommodate the cushion member 1055 therein. In at least one embodiment, a size and a shape of the mounting recess 1056 corresponds to the size and shape of the cushion member 1055. The first through holes 1054 may pass through the mounting recess 1056. The first through holes 1054 may communicate with the cavity 1053. The cushion member 1055 may define a plurality of second through holes 1057 corresponding in position to the first through holes 1054 one-to-one. Thus, the second through holes 1057 also communicate with the cavity 1053. When the circuit board 20 is supported on the base 102, the circuit board 20 covers the cushion member 1055 and the second through holes 1057. In at least one embodiment, the cushion member 1055 is made of elastic materials, such as rubber. The cushion member 1055 may absorb pressure between the cover plate 101 and the base 102 to prevent damage to the circuit board 20. In at least one embodiment, a size and a shape of the cushion member 1055 corresponds to a size and shape of the circuit board 20 to ensure that the circuit board 20 covers the second through holes 1057.

In at least one embodiment, the main body 105 may be made of fiberglass, and the bottom plate 106 may be made of aluminum. The bottom plate 106 is arranged opposite to the top plate 1051. The peripheral wall 1052 surrounds a periphery of the bottom plate 106 to enclose the cavity 1053.

In at least one embodiment, the bottom plate 106 is coupled to the peripheral wall 1052 by a plurality of screws or other affixing means. In detail, a surface of the peripheral wall 1052 away from the top plate 1051 defines a fixing hole 1058 in each of four corner portions of the peripheral wall 1052. Correspondingly, the bottom plate 106 may define a first mounting hole 1061 in each of four corner portions of the bottom plate 106. The bottom plate 106 may be fixed to the peripheral wall 1052 by screws passing through the fixing holes 1058 and the corresponding first mounting holes 1061. In other embodiments, the bottom plate 106 may be fixed to the main body 105 by adhesive mechanisms, latching mechanisms, or other securing mechanisms.

The base 102 may further include a sealing member 108. The sealing member 108 is arranged between the peripheral wall 1052 and the bottom plate 106. The sealing member 108 may be substantially rectangular frame-shaped. The sealing member 108 may seal any gaps between the peripheral wall 1052 and the bottom plate 106. In at least one embodiment, the sealing member 108 is made of rubber. The sealing member 108 may define a second mounting hole 1081 in each of four corner portions of the sealing member 108 corresponding to the first mounting holes 1061. The sealing member 108 may be fixed between the peripheral wall 1052 and the bottom plate 106 by screws passing through the first mounting holes 1061, the second mounting holes 1081, and the fixing holes 1058.

The bottom plate 106 may further define a connecting hole 1062 passing through the bottom plate 106 and communicating with the cavity 1053. In detail, a first end of the connecting hole 1062 communicates with the cavity 1053, and another end of the connecting hole 1062 is coupled to a suction head 1063. The suction head 1063 may be coupled to a suction device (not shown). When the circuit board 20 is supported on the top plate 1051 and covers the first through holes 1054, the suction device may be turned on to suck out the air from the cavity 1053, thereby adhering the circuit board 20 to the top plate 1051 to assist in holding the circuit board 20 in place. The circuit board 20 adhered to the top plate 1051 can ensure that the circuit board 20 is held flat in place.

In at least one embodiment, the peripheral wall 1052 may include a plurality of partitioning plates 1059 to partition the cavity 1053 into a plurality of sub-cavities 30. Each sub-cavity 30 may correspond to one connecting hole 1062, such that the suction device can suck out the air from each sub-cavity through the corresponding connecting hole 1062.

A bottom surface of the bottom plate 106 may include a plurality of supporting legs 1064. In at least one embodiment, the bottom plate 106 includes four supporting legs 1064, each supporting leg 1064 being arranged at a corresponding corner of the bottom plate 106. In at least one embodiment, the supporting legs 1064 may be made of rubber.

The connecting assembly 103 is used for coupling the cover plate 101 to the base 102. The connecting assembly 103 is substantially rectangular. The connecting assembly 103 may be fixed to the main body 105 by screws or other affixing means. The connecting assembly 103 includes a protrusion 1031 extending from opposite sides of the connecting assembly 103. The first end 1011 of the cover plate 101 is rotationally coupled between the protrusions 1031 by a first connecting rod 1032. In detail, each protrusion 1031 defines a first connecting hole 1033, and the first end 1011 of the cover plate 101 defines a second connecting hole 1014. The first connecting rod 1032 passes through the first connecting holes 1033 and the second connecting hole 1014 to couple the first end 1011 to the connecting assembly 103.

The latching assembly 104 is used for latching the cover plate 101 to the base 102. The latching assembly 104 may include a limiting portion 1041 and a latching portion 1042. The limiting portion 1041 is substantially rectangular and includes two extending portions 1043. The extending portions 1043 extend from opposite sides of the limiting portion 1041. Each of the extending portions 1043 may include a fixing portion 1044 extending from an end of the extending portion 1043 away from the limiting portion 1041. The fixing portion 1044 may fix the latching assembly 104 to the main body 105 by screws or other affixing means to fix the fixing portion 1044 to the main body 105.

The latching portion 1042 is substantially rectangular and includes a hook portion 1045. An end of the latching portion 1042 away from the hook portion 1045 is received between the two extending portions 1043. In detail, the latching portion 1042 includes a second connecting rod (not shown). The extending portions 1043 may define a third connecting hole 1046, and the latching portion 1042 may define a fourth connecting hole (not shown). The second connecting rod may pass through the third connecting holes 1046 and the fourth connecting hole to rotationally couple the latching portion 1042 to the limiting portion 1041. When the circuit board 20 is placed on the base 102 and the cover plate 101 is rotated to cover the circuit board 20, the hook portion 1045 of the latching portion 1042 latches the second end 1012 of the cover plate 101 to hold the circuit board 20 in place between the cover plate 101 and the base 102. To release the circuit board 20, the hook portion 1045 may be rotated to unlatch the second end 1012 of the cover plate 101.

The fixing apparatus 10 may further include a switch 109 to turn on the suction device. In at least one embodiment, the switch 109 may be located on the bottom plate 106. In at least one embodiment, the switch 109 may be a manual switch.

The fixing apparatus 10 as described above may hold the circuit board 20 in place and prevent the circuit board 20 from damage during a process of removing components from the circuit board 20.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A fixing apparatus for holding a circuit board in place, the fixing apparatus comprising:
   a cover plate comprising a first end and a second end;
   a base configured to support the circuit board thereon;
   a connecting assembly configured to hinge-couple the first end of the cover plate to the base; and
   a latching assembly configured to latch the second end of the cover plate to the base, so as to hold the circuit board in place between the base and the cover plate;
   wherein the connecting assembly comprises a protrusion extending from each opposite side of the connecting assembly, the first end of the cover plate is coupled between the protrusions and hinge-coupled to the base.

2. The fixing apparatus of claim 1, wherein a surface of the cover plate facing the base defines a recess for accommodating the circuit board.

3. The fixing apparatus of claim 1, wherein:
   the base is hollow and comprises a main body; the first end of the cover plate is coupled to the main body by the connecting assembly;
   the second end of the cover plate is coupled to the main body by the latching assembly;
   the connecting assembly and the latching assembly are located at opposite sides of the main body.

4. The fixing apparatus of claim 3, wherein:
   the main body comprises a top plate, a peripheral wall, and a bottom plate;
   the peripheral wall surrounds a periphery of the top plate;
   a cavity is defined by the peripheral wall;
   the bottom plate covers the cavity.

5. The fixing apparatus of claim 4, wherein the main body comprises a sealing member arranged between the peripheral wall and the bottom plate to seal any gaps between the peripheral wall and the bottom plate.

6. The fixing apparatus of claim 4, wherein a first through hole is defined in the top plate; the first through hole communicates with the cavity.

7. The fixing apparatus of claim 6, wherein the main body comprises a cushion member; a mounting recess is defined in the top plate; the cushion member is received in the mounting recess.

8. The fixing apparatus of claim 7, wherein the cushion member defines a second through hole corresponding in position with the first through hole such that the second through hole communicates with the cavity.

9. The fixing apparatus of claim 4, wherein a connecting hole is defined in the bottom plate; the connecting hole passes through the bottom plate and communicates with the cavity.

10. The fixing apparatus of claim 4, wherein a bottom surface of the bottom plate comprises a plurality of supporting legs for supporting the bottom plate.

11. The fixing apparatus of claim 1, wherein:
    the latching assembly comprises a limiting portion and a latching portion;
    the limiting portion fixes the latching assembly to the base;
    the limiting portion comprises two extending portions extending from opposite sides of the limiting portion; the latching portion is located between the two extending portions; the latching portion latches the second end of the cover plate.

* * * * *